US005995453A

United States Patent [19]
Hirata

[11] Patent Number: 5,995,453
[45] Date of Patent: Nov. 30, 1999

[54] COMPOSITE ULTRASONIC TRANSDUCER

[75] Inventor: Yoshihiro Hirata, Ako-gun, Japan

[73] Assignee: Sumitomo Electric Industries, Ltd., Osaka, Japan

[21] Appl. No.: 09/165,617

[22] Filed: Oct. 2, 1998

[30] Foreign Application Priority Data

Oct. 6, 1997 [JP] Japan .................................... 9-272423
Sep. 18, 1998 [JP] Japan .................................. 10-264548

[51] Int. Cl.[6] ............................ H04R 17/00; H01L 41/08
[52] U.S. Cl. .......................... 367/155; 367/157; 310/357; 310/358
[58] Field of Search .................................... 310/337, 357, 310/358; 367/153, 155, 157, 164

[56] References Cited

U.S. PATENT DOCUMENTS 4,412,148 10/1983 Klicker et al. .......................... 310/358
4,628,223 12/1986 Takeuchi et al. ....................... 310/358
5,164,920 11/1992 Bast et al. .
5,818,149 10/1998 Safari et al. ............................ 310/358

FOREIGN PATENT DOCUMENTS 58-22046 2/1983 Japan .
4-232425 8/1992 Japan .

OTHER PUBLICATIONS

IEEE Trans. Sonics Ultrasonics, vol. SU–32, 1985, pp. 481–497 Article entitled "Piezoelectric Composite Materials for Ultrasonic Transducer Applications. Part I: Resonant Modes of Vibration of PZT Rod–Polymer Composites" by T.R. Gururaja et al.

*Primary Examiner*—Ian J. Lobo
*Attorney, Agent, or Firm*—W. F. Fasse; W. G. Fasse

[57] ABSTRACT

In a composite ultrasonic transducer, each of a plurality of piezoelectric ceramic columns included in a resin plate has a given circular cross-section and passes through the resin plate in a direction of a thickness of the resin plate, and central axes of the piezoelectric ceramic columns are regularly arranged at positions corresponding to nodes of a regular triangle network.

9 Claims, 5 Drawing Sheets

FIG.3
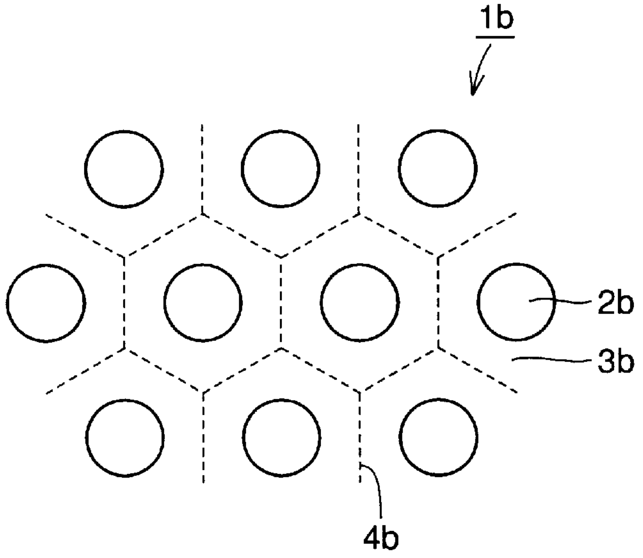
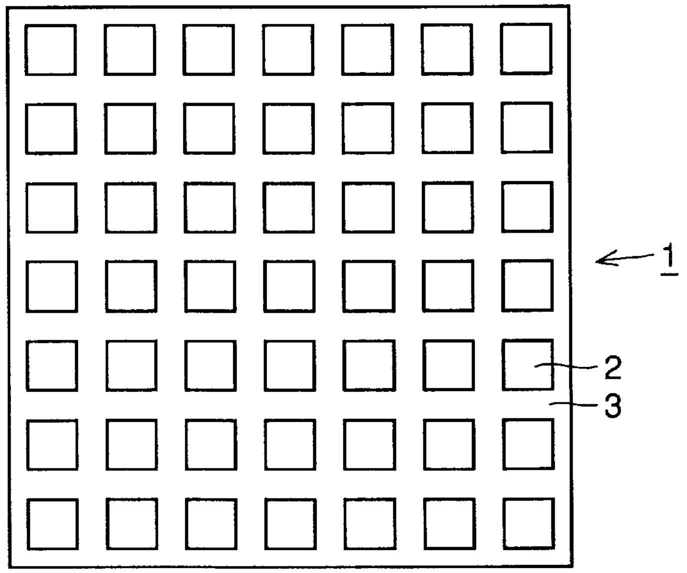
FIG.4A
PRIOR ART
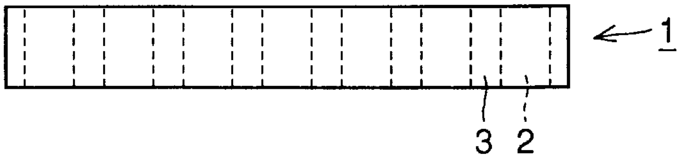
FIG.4B
PRIOR ART

COMPOSITE ULTRASONIC TRANSDUCER

BACKGROUND OF THE INVENTION

1. Field of the Invention

The present invention relates to a composite ultrasonic transducer formed by regularly arranging a plurality of piezoelectric ceramic columns in a resin plate. Such a composite ultrasonic transducer is applicable to a medical ultrasonic diagnostic apparatus and an industrial nondestructive inspection apparatus.

2. Description of the Background Art

A piezoelectric ceramic plate has been utilized for a long time as an ultrasonic transducer. However, the piezoelectric ceramic plate has an acoustic impedance of approximately 30 MRayl which is much higher than an acoustic impedance of approximately 1.5 MRayl of any biological object, and therefore has a low efficiency of transmitting ultrasonic waves from the piezoelectric ceramic plate to the biological object. In addition, compared with piezoelectric resin such as polyvinyliden fluoride, the piezoelectric ceramic plate has a low efficiency in receiving an ultrasonic signal to convert it to an electric signal while having a high efficiency of converting an electric signal to an ultrasonic signal. In view of these problems, a composite ultrasonic transducer formed of a resin plate including an array of a plurality of small piezoelectric ceramic columns has been proposed and studied (see IEEE Trans. Sonics Ultrasonics, Vol. SU-32, 1985, pp. 481–497).

A composite ultrasonic transducer initially was fabricated by arranging piezoelectric ceramic columns each having a circular shape in a cross section plane perpendicular to a longitudinal axis and filling the space between those ceramic columns with resin. The piezoelectric ceramic columns each had a cross-sectional diameter of at least approximately 300 μm. It is known that various characteristics of the composite ultrasonic transducer depend on the dimension of the piezoelectric ceramic column and the frequency of the ultrasonic wave. For example, if the composite ultrasonic transducer is used in a higher frequency range, piezoelectric ceramic columns each having a smaller cross-sectional area should be used in view of the sensitivity characteristic. Owing to such circumstances, in the field of the medical ultrasonic diagnostic art using ultrasonic waves in the frequency range of at least 2.5 MHz, the composite ultrasonic transducer including the array of piezoelectric ceramic columns each having the cross-sectional area of 300 μm or more is not employed.

In the field of the semiconductor art around 1980, a dicing technique using a diamond saw to cut a silicon substrate began to be employed. The dicing technique was also utilized for fabricating a composite ultrasonic transducer which can be used in the frequency range of 2.5 MHz or more.

For example, according to Japanese Patent Laying-Open No. 58-22046, a piezoelectric ceramic plate is first adhered onto a ferrite substrate, and the ceramic plate is laterally and vertically cut with a pitch of 300 μm using the dicing technique. Consequently, a plurality of piezoelectric ceramic columns each having a square cross-section of approximately 150 μm×150 μm are arrayed on the ferrite substrate at positions corresponding to nodes of a square network (hereinafter referred to as "square network array"). Cut grooves between the piezoelectric ceramic columns are filled with a resin layer and thereafter the resin layer and the plurality of piezoelectric ceramic columns are separated from the ferrite substrate to form a plate-like composite ultrasonic transducer as schematically illustrated in the plan view of FIG. 4A and the side view of FIG. 4B. Specifically, a plurality of fine piezoelectric ceramic columns 2 each having the square cross section are arrayed in the square network in a resin plate 3 in a composite ultrasonic transducer 1.

A problem of composite ultrasonic transducer 1 is that an undesirable lateral mode of high-frequency resonance occurs in a direction parallel to a major surface of plate-like transducer 1, while a desired vertical mode of ultrasonic oscillation in a direction of the thickness of transducer 1 is generated. If the lateral mode resonance occurs in a frequency range close to a frequency band of the vertical mode ultrasonic oscillation used, for example, for the ultrasonic diagnosis, the lateral mode resonance accelerates the lateral spreading of ultrasonic waves generated by the vertical mode resonance, leading to a reduction of the resolution of an ultrasonic image. In order to avoid the reduction of the resolution, a central frequency used for the diagnosis is limited to half the lateral mode resonance frequency or less. The resolution of the ultrasonic image is also reduced by a reduction of the frequency of the employed ultrasonic waves.

Generally, the frequency of the lateral mode resonance of the composite ultrasonic transducer is inversely proportional to the pitch of the array of the piezoelectric ceramic columns. Therefore, the array pitch may be made finer in order to increase the frequency of the lateral mode resonance. In composite ultrasonic transducer 1 as illustrated in FIGS. 4A and 4B, one arbitrary side of one arbitrary piezoelectric ceramic column 2 having the square cross-section faces parallel to one side of another ceramic column located closest to the one arbitrary ceramic column. It is considered that the lateral mode resonance is likely to occur due to the interaction between the sides facing in parallel to each other and close to each other.

With such circumstances and progress in the x-ray lithography art, Japanese Patent Laying-Open No. 4-232425 (U.S. Pat. No. 5,164,920) proposes a composite ultrasonic transducer as shown in FIG. 6 fabricated using x-ray lithography. Referring to the perspective view of FIG. 6, a composite ultrasonic transducer 1*a* includes a plurality of tapered piezoelectric ceramic columns 2*a* regularly arranged in a resin plate 3*a*. Specifically, each of tapered piezoelectric ceramic columns 2*a* has a trapezoidal shape by a longitudinal cross-section plane including a longitudinal central axis, and has a hexagonal shape at a cross-section perpendicular to the central axis.

Each of the piezoelectric ceramic columns 2*a* is formed to have the hexagonal cross-section in order to densely arrange ceramic columns 2*a* in resin plate 3*a*. Each of the piezoelectric ceramic columns 2*a* is tapered in order to allow one side of a first arbitrary ceramic column 2*a* having the hexagonal cross-section to face with an angle twice the taper angle toward one side of a second ceramic column located closest to the first ceramic column without being arranged parallel thereto. In other words, those sides of adjacent ones of the ceramic columns facing closest to each other are not parallel to each other so that the interaction between those sides decreases and thus the undesirable lateral mode resonance is considered to be suppressed.

It is considered that, as the taper angle of the piezoelectric ceramic columns 2*a* is made larger, the undesirable lateral mode resonance could be suppressed more effectively. However, if the taper angle is made too large, the desired vertical oscillation mode in the longitudinal direction of piezoelectric ceramic columns 2*a* could become non-uniform. Further, even if x-ray lithography is used, it would be difficult to form fine piezoelectric ceramic column 2*a* having precisely controlled taper angle and hexagonal cross-section.

SUMMARY OF THE INVENTION

One object of the present invention is to provide a composite ultrasonic transducer which can be fabricated relatively easily and which achieves sufficiently suppressed undesired lateral mode resonance.

A composite ultrasonic transducer according to the present invention includes a resin plate, and a plurality of fine piezoelectric ceramic columns regularly arranged therein, and is characterized in that each of the piezoelectric ceramic columns has a substantially circular shape in a cross-section perpendicular to a longitudinal central axis of each column and substantially passes through the resin plate in the direction of the thickness of the plate, and that the central axes of the plurality of piezoelectric ceramic columns are arranged at one major surface of the resin plate at positions substantially corresponding to nodes of a regular triangle network.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 3 is a schematic plan view showing a location where a loop of a standing wave is to be generated if lateral mode resonance occurs in the composite ultrasonic transducer of the present invention.

FIG. 4A schematically shows a plan view of a composite ultrasonic transducer according to the prior art, and FIG. 4B shows a side view thereof.

DETAILED DESCRIPTION OF THE PREFERRED EMBODIMENTS

Figure 1A:
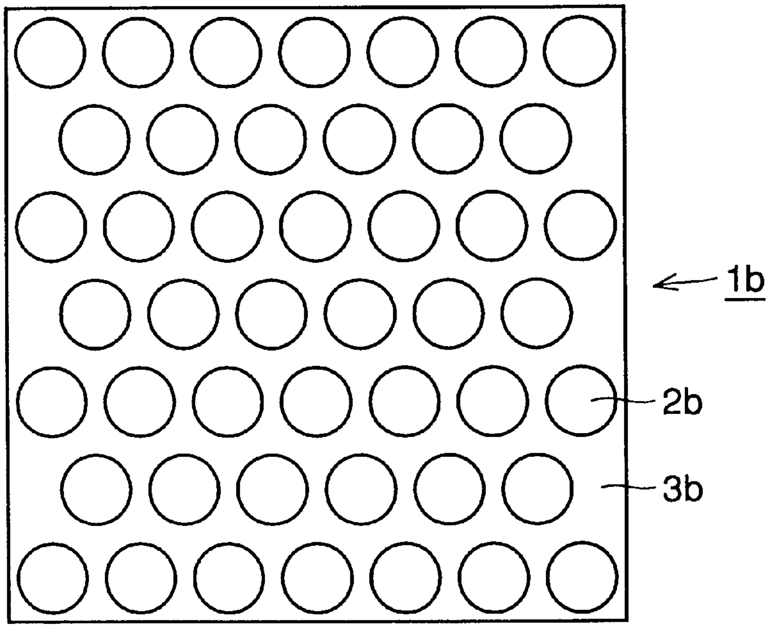
FIG. 1A schematically shows a plan view of composite ultrasonic transducer according to one embodiment of the present invention.
Figure 1B:
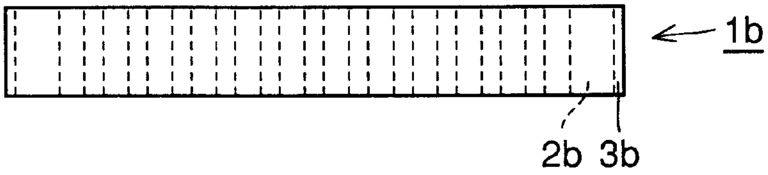
FIG. 1B shows a side view thereof.

Referring to the plan view of FIG. 1A and the side view of FIG. 1B, one example of a composite ultrasonic transducer according to one embodiment of the present invention is schematically shown. A plurality of piezoelectric ceramic columns 2*b* are regularly arranged in a resin plate 3*b* in a composite ultrasonic transducer 1*b*. Each of piezoelectric ceramic columns 2*b* has a rectangular shape in a longitudinal cross-section plane including a longitudinal central axis of the column, and has a circular shape in a cross-section plane perpendicular to the central axis. In other words, each of piezoelectric ceramic columns 2*b* is not tapered and has a constant cross-sectional diameter and is particularly shaped as a right circular cylinder as shown in FIGS 1A AND 1B. The central axes of these piezoelectric ceramic columns 2*b* are arranged at positions corresponding to substantially all nodes of a regular triangle network at one major surface of resin plate 3*b* (hereinafter referred to as "regular triangle network array"), wherein the nodes are especially located at the vertices of equilateral traingles making up the array as shown in FIG. 1A.

The schematic cross-sections of FIGS. 2A–2J show one example of a manufacturing process of the composite ultrasonic transducer illustrated in FIGS. 1A and 1B.

Figure 2A:
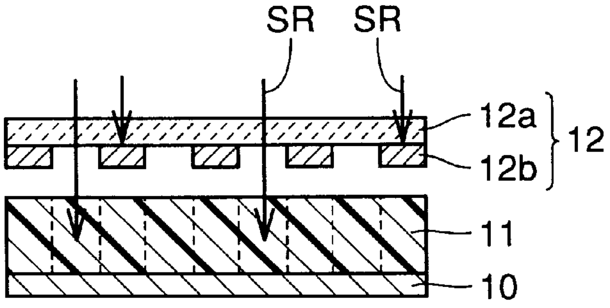
FIGS. 2A–2J are cross-sectional views schematically showing respective steps in a process of manufacturing the composite ultrasonic transducer shown in FIG. 1.

Referring to FIG. 2A, an x-ray sensitive resist layer 11 is formed on a conductive substrate 10. Synchrotron radiation (SR) is directed onto resist layer 11 through an x-ray mask 12. X-ray mask 12 includes a membrane 12*a* formed of silicon nitride with a thickness of 2 μm, and an x-ray absorber pattern 12*b* formed of a tungsten film with a thickness of 5 μm. X-ray absorber pattern 12*b* includes a plurality of circular openings arrayed to form the regular triangle network. A stencil mask (metal mesh without the membrane) fabricated by photolithography and plating may be used as the x-ray mask.

Figure 2B:
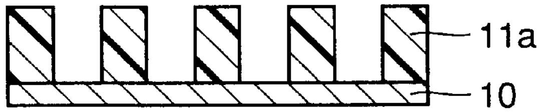

Referring to FIG. 2B, resist layer 11 subjected to the SR radiation is developed, and a resist structure 11*a* is formed.

Figure 2C:
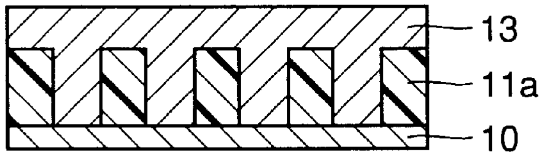

Referring to FIG. 2C, a nickel mold 13 is formed by plating with nickel using conductive substrate 10 as an electrode for plating. Nickel mold 13 includes a plurality of fine cylinders arranged according to the regular triangle network array. For example, the central axes of the cylinders are arranged with a spacing of 46 μm, and each cylinder may have a cross-sectional diameter of 30 μm and a height of 300 μm.

Figure 2D:
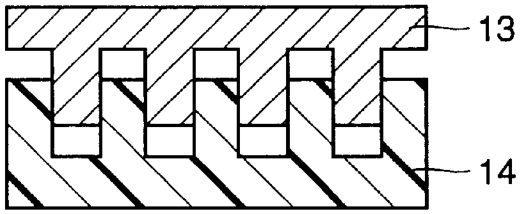

Referring to FIG. 2D, resin molding using nickel mold 13 generates a resin mold 14. Resin mold 14, after being separated from mold 13 has a negative structure generated by the structure of mold 13, and includes a plurality of fine holes arranged according to the regular triangle network array. For example, the central axes of the holes are arranged with a spacing of 46 μm, and each hole may have a cross-sectional diameter of 30 μm and a depth of 300 μm.

Figure 2E:
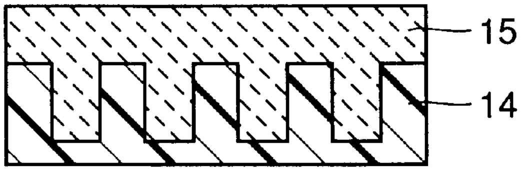

Referring to FIG. 2E, slurry of piezoelectric ceramic is applied onto resin mold 14, and the slurry is dried to form a dry cake 15 of the piezoelectric ceramic.

Figure 2F:
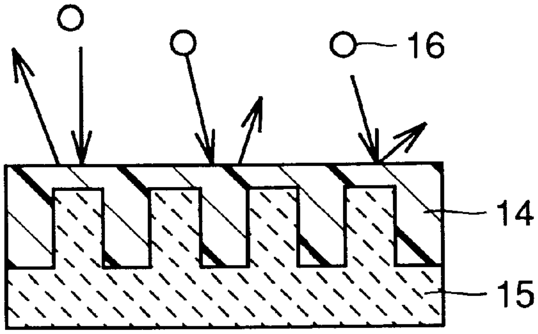

Referring to FIG. 2F, resin mold 14 is removed from ceramic cake 15 using oxygen plasma 16.

Figure 2G:
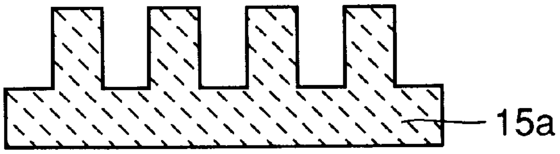

Referring to FIG. 2G, piezoelectric ceramic cake 15 is heated to 500° C. to remove binder therefrom, and thereafter sintered at 1200° C. to produce a slightly contracted sintered piezoelectric ceramic structure 15*a*. The spacing of axes of fine ceramic columns included in sintered piezoelectric ceramic structure 15*a* is, for example, approximately 38 μm, and each ceramic column has a cross-sectional diameter of approximately 25 μm and a height of approximately 250 μm, giving an aspect ratio of approximately 10.

Figure 2H:
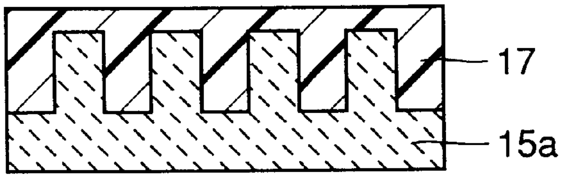

Referring to FIG. 2H, piezoelectric ceramic structure 15*a* is covered with, for example, epoxy resin 17, and accordingly the space between the fine ceramic columns is filled with resin 17.

Figure 2I:
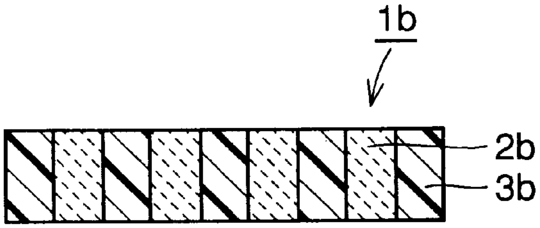

Referring to FIG. 2I, the base of ceramic structure 15*a* and the base of filling resin 17 are removed by polishing to leave a plurality of fine piezoelectric ceramic columns 2*b* with a desired height embedded in the remaining resin 17 in the form of a plate 3*b*. Consequently, composite ultrasonic transducer 1*b* including where a plurality of fine piezoelectric ceramic columns 2*b* regularly arranged in resin plate 3*b*, is obtained. Generally, if the length of each piezoelectric ceramic column is reduced, or the composite ultrasonic transducer is made thinner, the frequency of ultrasonic waves generated by the vertical mode resonance tends to become higher.

Figure 2J:
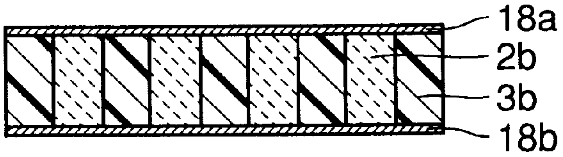

Referring to FIG. 2J, an upper electrode 18*a* and a lower electrode 18*b* are formed in order to input an electric signal into the composite ultrasonic transducer 1*b* or to output an electric signal therefrom. Each of electrodes 18*a* and 18*b* is formed, for example, by depositing a chromium layer having a thickness of 0.1 μm and a gold layer having a thickness of 0.4 μm by sputtering.

As the first example of the present invention, composite ultrasonic transducer 1*b* as shown in FIGS. 1A and 1B was actually fabricated according to the process steps shown in FIGS. 2A–2I using lead zirconate titanate (PZT) as a piezoelectric material and epoxy resin as a resin material. In composite transducer 1*b* of the first example, spacing of central axes of a plurality of fine piezoelectric ceramic columns 2*b* was 38 μm, and each ceramic column 2*b* had a cross-sectional diameter of 25 μm and a height of 110 μm giving an aspect ratio of 4.4. Similarly to the composite ultrasonic transducer of the first example, a composite ultrasonic transducer 1 as shown in FIGS. 4A and 4B was actually fabricated as an example for comparison, according to the process steps shown in FIGS. 2A–2B using PZT and epoxy resin. In this example for comparison, the spacing of central axes of a plurality of fine piezoelectric ceramic columns 2 was 38 μm, and each ceramic column 2 had a square cross-section of 25 μm×25 μm and a height of 110 μm.

The first example and the example for comparison were tested and consequently an ultrasonic frequency of approximately 12 MHz generated by the vertical mode resonance was observed in both of the first example and the example for comparison. Although the undesirable lateral mode resonance was not observed in the first example of the present invention,the lateral mode resonance was observed with a frequency of approximately 20 MHz and an electromechanical coupling coefficient of approximately 20% in the example for comparison.

In order to avoid the influence of the undesirable lateral mode resonance that occurred in the composite ultrasonic transducer, the vertical mode resonance frequency should be at most half the lateral mode resonance frequency. However, in the case of the composite ultrasonic transducer of the example for comparison, it was impossible to prevent the ultrasonic waves generated by the vertical mode resonance from being influenced by the undesirable lateral mode resonance, since the ultrasonic waves caused by the vertical mode resonance had a frequency of approximately 12 MHz which is higher than half of the frequency, namely about 20 MHz, caused by the undesirable lateral mode resonance.

As the second example of the present invention, a composite ultrasonic transducer having only its dimensions changed relative to the composite ultrasonic transducer of the first example was actually fabricated. Specifically, according to the second example, the spacing of central axes of a plurality of piezoelectric ceramic columns 2*b* was 69 μm, and each ceramic column 2*b* had a cross-sectional diameter of 46 μm and a height of 230 μm giving an aspect ratio of 5. The composite ultrasonic transducer of the second example was tested and consequently ultrasonic waves caused by the vertical mode resonance of 5.8 MHz were observed. However, a lateral mode resonance was not observed in the range of 2–18 MHz.

As heretofore described, the undesirable lateral mode resonance is generated in composite ultrasonic transducer 1 where piezoelectric ceramic columns 2 each having a square cross-section are arranged according to the square network array, while the undesirable lateral mode resonance is not observed in composite ultrasonic transducer 1*b* where piezoelectric ceramic columns 2*b* each having a circular cross-section are arranged according to the triangle network array. There could be two reasons for it as below.

The first reason is that if piezoelectric ceramic column 2*b* has a circular cross-section as shown in FIG. 3, the side of ceramic column 2*b* is formed of a curved surface instead of a flat surface. More specifically, when the undesirable lateral mode resonance propagates from one piezoelectric ceramic column to an adjacent ceramic column through the interaction of the sidewalls thereof, the thickness of a resin layer 3*b* between the sidewalls locally varies. Therefore, development and propagation of the lateral resonance mode having a specific frequency would be suppressed by non-uniformity of the thickness of the resin layer intervening between the sidewalls of ceramic columns 2*b* adjacent to each other.

Figure 5:
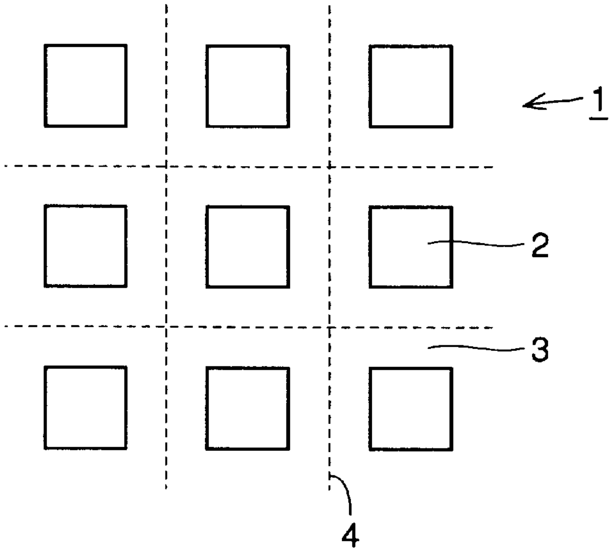
FIG.5 PRIOR ART
FIG. 5 is a schematic plan view showing a location of a loop of a standing wave in the lateral mode oscillation generated in the composite ultrasonic transducer shown in FIG. 4A.

The second reason is as follows. If piezoelectric ceramic columns 2 are arranged according to the square network array as shown in FIG. 5, the location of the loop of the standing wave generated by the undesirable lateral mode resonance forms a straight line as shown by broken line 4. On the other hand if the piezoelectric ceramic columns 2*b* are arranged according to the triangle network array, the location of the loop of the standing wave in the undesirable lateral mode resonance forms the hexagonal network as shown by broken line 4*b* of FIG. 3. Accordingly, if piezoelectric ceramic columns 2 are arranged according to the square network array as shown in FIG. 5, the lateral mode resonance is likely to occur since the location of the loop of the standing wave linearly continues. On the other hand, if the piezoelectric ceramic columns 2*b* are arranged according to the triangle network array as shown in FIG. 3, the lateral mode resonance is suppressed since the location of the loop of the standing wave does not run or extend continuously. As also seen in FIG. 3, each respective ceramic column 2*b* is surrounded at equal spacing distances by six neighboring columns 2*b* arranged in an equilateral hexagonal pattern.

In composite ultrasonic transducer 1*b* of the present invention, the effect of the circular cross-section of each piezoelectric ceramic column 2*b* and the effect of the regular triangle network array of ceramic columns 2*b* are combined to suppress the undesirable lateral mode resonance, and consequently the undesirable lateral mode frequency is not observed.

Figure 6:
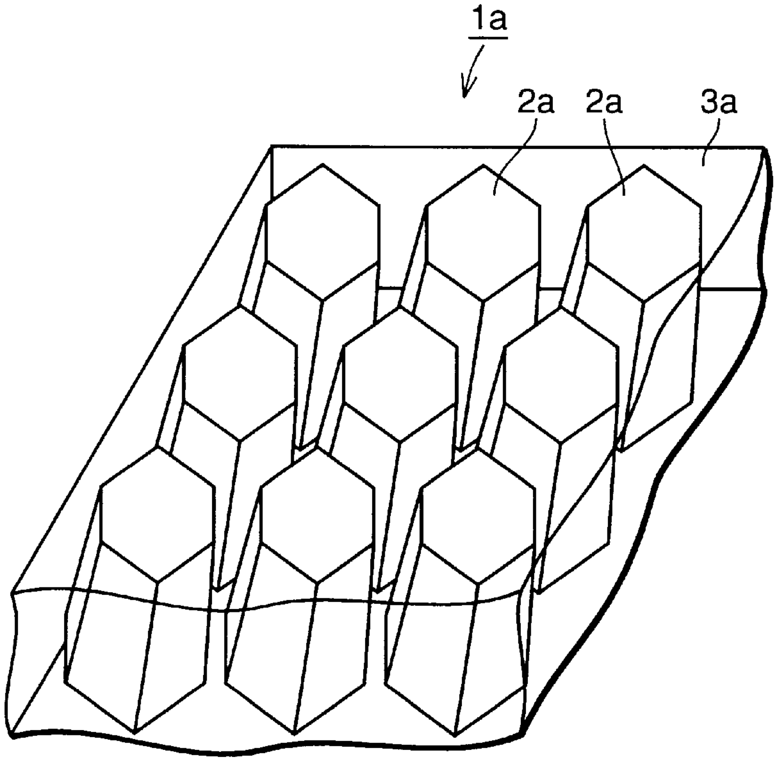
FIG.6 PRIOR ART
FIG. 6 is a schematic perspective view showing another example of a composite ultrasonic transducer according to the prior art.

Piezoelectric ceramic columns 2*b* each having the circular cross-section could be disadvantageous for densely arranging them in the resin plate compared with piezoelectric ceramic columns 2*a* each having the hexagonal cross-section as shown in FIG. 6. However, the composite ultrasonic transducer preferably includes piezoelectric ceramic columns with a volume fraction of approximately 40% in the resin plate considering the sensitivity as described in Japanese Patent Laying-Open No. 60-97800 (U.S. Pat. No. 4,683,396). The actual volume fraction of the piezoelectric ceramic columns in the resin plate of the composite ultrasonic transducer of the first example according to the present invention is 39%. Accordingly, the volume fraction of approximately 40% is easily achieved even if piezoelectric ceramic columns 2*b* each has the circular cross-section. Use of piezoelectric ceramic columns 2*b* each having the circular cross-section instead of the hexagonal cross-section is thus not disadvantageous.

According to the present invention, a composite ultrasonic transducer that can be relatively easily fabricated with a sufficiently suppressed undesirable lateral mode resonance as described above can be provided.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A composite ultrasonic transducer comprising:

a resin plate; and a plurality of fine piezoelectric ceramic columns regularly arranged in said resin plate, characterized in that each one of said ceramic columns has a substantially circular shape with a same prescribed diameter in a cross-section perpendicular to a longitudinal central axis of said one of said columns, and substantially passes through said resin plate in a direction of a thickness of said resin plate, and said central axes of said ceramic columns intersect a major surface of said resin plate at positions corresponding to substantially all nodes of a regular triangle network array.

2. The composite ultrasonic transducer according to claim 1, wherein each one of said ceramic columns has said substantially circular shape with said prescribed diameter uniformly without tapering along a length of said one of said columns in a direction of said longitudinal central axis.

3. The composite ultrasonic transducer according to claim 2, wherein each one of said ceramic columns is a respective right circular cylinder with said longitudinal central axis perpendicular to said major surface of said resin plate.

4. The composite ultrasonic transducer according to claim 3, wherein said prescribed diameter is in a range from 25 $\mu$m to 46 $\mu$m, each one of said ceramic columns has a height along said longitudinal central axis in a range from 110 $\mu$m to 250 $\mu$m, said ceramic columns are spaced apart from each other at a closest spacing between said longitudinal central axes of adjacent ones of said ceramic columns in a range from 38 $\mu$m to 69 $\mu$m, and each one of said ceramic columns has an aspect ratio of said height relative to said prescribed diameter in a range from 4.4 to 10.

5. The composite ultrasonic transducer according to claim 1, wherein at least a group of said ceramic columns in a central region of said composite ultrasonic transducer are each respectively surrounded at equal spacings by six neighboring ones of said ceramic columns arranged in a hexagonal pattern as seen in a plane parallel to said major surface of said resin plate.

6. The composite ultrasonic transducer according to claim 1, wherein said regular triangle network array consists of said nodes arranged at vertices of equilateral triangles.

7. A composite ultrasonic transducer comprising:

a polymer matrix shaped in the form of a plate with two major surfaces; and a plurality of piezoelectric ceramic columns embedded in said polymer matrix so as to extend between said two major surfaces, with said polymer matrix around and between adjacent ones of said ceramic columns;

wherein all of said ceramic columns each respectively have the same circular cylindrical shape about a respective longitudinal cylinder axis and the same circular cylinder diameter;

wherein all of said ceramic columns are arranged such that said longitudinal cylinder axes are parallel to each other and respectively intersect a plane of one of said major surfaces at respective locations that are positioned so as to form a regular equilateral triangular repeating pattern of said locations in which each respective one of said locations and any two of said locations adjacent to said each respective one of said locations form vertices of a respective equilateral triangle.

8. The composite ultrasonic transducer according to claim 7, wherein said circular cylindrical shape of each one of said ceramic columns is a right circular cylindrical shape with said longitudinal cylinder axis extending perpendicular to said one of said major surfaces.

9. The composite ultrasonic transducer according to claim 7, wherein said circular cylinder diameter is in a range from 25 $\mu$m to 46 $\mu$m, each one of said ceramic columns has a height along said longitudinal cylinder axis in a range from 110 $\mu$m to 250 $\mu$m, said ceramic columns are spaced apart from each other such that a spacing between said longitudinal cylinder axes of adjacent ones of said ceramic columns is in a range from 38 $\mu$m to 69 $\mu$m, and each one of said ceramic columns has an aspect ratio of said height relative to said cylinder diameter in a range from 4.4 to 10.

* * * * *

UNITED STATES PATENT AND TRADEMARK OFFICE

CERTIFICATE OF CORRECTION

PATENT NO. : 5,995,453

DATED : Nov. 30, 1999

INVENTOR(S) : Hirata

It is certified that error appears in the above-identified patent and that said Letters Patent is hereby corrected as shown below:

Col. 1, line 30, after "was" insert --initially--;

Col. 2, line 46, after "shape", replace "by" by --in--;
line 48, after "shape", replace "at" by --in--;

Col. 3, line 10, after "achieves" insert --a--;

Col. 5, line 1, after "1b" insert --,--, after "including" , delete "where".

Signed and Sealed this

Eighteenth Day of July, 2000

Attest:

Q. TODD DICKINSON

*Attesting Officer* *Director of Patents and Trademarks*